(12) United States Patent
Mano et al.

(10) Patent No.: US 6,747,907 B2
(45) Date of Patent: Jun. 8, 2004

(54) VOLTAGE DETECTION LEVEL CORRECTION CIRCUIT AND SEMICONDUCTOR DEVICE

(75) Inventors: Yoshitaka Mano, Kyoto (JP); Joji Nakane, Nara (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 52 days.

(21) Appl. No.: 10/307,376

(22) Filed: Dec. 2, 2002

(65) Prior Publication Data

US 2003/0103405 A1 Jun. 5, 2003

(30) Foreign Application Priority Data

Dec. 3, 2001 (JP) ........................................ 2001-368266

(51) Int. Cl.[7] .............................................. G11C 11/22
(52) U.S. Cl. ................... 365/226; 365/189.09; 365/145
(58) Field of Search ................................ 711/103, 107; 365/145, 189.09, 189.05, 226

(56) References Cited

U.S. PATENT DOCUMENTS 6,075,354 A 6/2000 Smith et al.
6,510,071 B2 * 1/2003 Oowaki ...................... 365/145

* cited by examiner

Primary Examiner—Shawn Riley
(74) Attorney, Agent, or Firm—Stevens, Davis, Miller & Mosher, LLP.

(57) ABSTRACT

In a power supply voltage detection circuit using a reference potential generation circuit, as represented by a band gap reference circuit according to a prior art, the correction of dispersion in the detection level cannot be carried out after the completion of diffusion and assembly. Therefore, a power supply voltage detection circuit 4 is provided with a reference potential generation circuit 1, a divided voltage potential generation circuit 2 and a differential amplification circuit 3 for comparing the divided voltage potential to the reference potential. Furthermore, a ferroelectric memory 5 which stores correction data for correcting the reference potential, a data latch circuit 7 for storing correction data that has been read out, and a microcomputer logic unit 6 for controlling ferroelectric memory 5 as well as data latch circuit 7 are provided. The reference potential is altered according to correction data so that dispersion in the power supply voltage detection level is reduced.

14 Claims, 12 Drawing Sheets

VOLTAGE DETECTION LEVEL CORRECTION CIRCUIT AND SEMICONDUCTOR DEVICE

BACKGROUND OF THE INVENTION

1. Field of the Invention

This invention relates to a voltage detection level correction circuit using a non-volatile memory and to a semiconductor device on which this circuit is mounted.

2. Description of Prior Art

A ferroelectric memory (FeRAM) makes possible reading and writing at a low voltage, as well as high speed operation, in comparison with other non-volatile memories (for example, flash memory or EEPROM). In contrast to this, there is a possibility wherein data rewrite may be carried out even under the condition of a voltage lower than that of a product specification and, therefore, a measure, exceeding the product specification, for preventing malfunction is introduced in the circuit from the point of view of data protection such that a power supply voltage detection circuit is mounted and a command from the outside is not accepted in the case of a voltage lower than, or including, the set voltage.

FIG. 10 shows a block diagram of a semiconductor device on which a ferroelectric memory, which has been conventionally utilized, is mounted. A reference potential generation circuit is denoted as 101, a reference potential output node of the reference potential generation circuit 101 is denoted as NBGRA, a divided voltage potential generation circuit for generating a divided voltage potential is denoted as 102, an output node of the divided voltage potential generation circuit 102 is denoted as NHALA, a differential amplification circuit for generating an output PORA at a CMOS level by amplifying a potential difference between output node NBGRA of reference potential generation circuit 101 and output node NHALA of divided voltage potential generation circuit 101 is denoted as 103, the output node of the differential amplification circuit 103 is denoted as PORA and a power supply voltage detection circuit formed of the reference potential generation circuit 101, the divided voltage potential generation circuit 102 and the differential amplification circuit 103 is denoted as 104. A ferroelectric memory for storing arbitrary information is denoted as 105. A microcomputer logic unit for controlling the ferroelectric memory 105 is denoted as 106.

In the present circuit, in the case that the power supply voltage is lower than the set level, that is to say, in the case that the potential level of node NBGR is higher than the potential level of node NHALA, the logic level of node PORA is set at "H" so that the ferroelectric memory 105 and the microcomputer logic unit 106 are converted to the deactivated condition. In addition, in contrast to this, in the case that the power supply voltage is higher than the set level, that is to say, the potential level of node NBGR is lower than the potential level of node NHALA, the logic level of node PORA is set at "L" so that the ferroelectric memory 105 and the microcomputer logic unit 106 are converted to the activated condition.

FIG. 11 is a block diagram of a band gap reference circuit showing one example of a reference potential generation circuit.

P channel type CMOS transistors are denoted as QP101, QP102, QP103, QP104 and QP105, N channel type CMOS transistors are denoted as QN101, QN102, QN103 and QN104, resistor elements are denoted as R101, R102 and R103, a differential amplification circuit for amplifying the potential difference between internal nodes N101 and N103 formed of transistors QP103, QP104, QP105, QN102, and QN103 is denoted as 107, diodes are denoted as Di101 and Di102 and the ground voltage is denoted as VSS.

The source of P channel type CMOS transistor QP101 is connected to power supply voltage VDD, and the gate and the drain are connected to node N104. The source of P channel type MOS transistor QP102 is connected to power supply voltage VDD, the gate is connected to node N104, and the drain is connected to node NBGRA. The source of P channel type MOS transistor QP103 is connected to power supply voltage VDD, the gate is connected to node N104, and the drain is connected to N105. The source of P channel type MOS transistor QP104 is connected to node N105, the gate is connected to node N101 and the drain is connected to N106. The source of P channel type MOS transistor QP105 is connected to node N105, the gate is connected to node N103 and the drain is connected to N107.

The gate of N channel type CMOS transistor QN101 is connected to node NBIAS, the source is connected to ground voltage VSS and the drain is connected to node N104. The gate and the drain of N channel type CMOS transistor QN102 are connected to node N106 and the source is connected to ground voltage VSS. The gate of N channel type CMOS transistor QN103 is connected to node N106, the source is connected to ground voltage VSS and the drain is connected to node N107. The gate of N channel type CMOS transistor QN104 is connected to node N107, the source is connected to ground voltage VSS and the drain is connected to node NBGRA.

As for the potential supplied to node NBIAS, a potential slightly higher than the threshold value (Vt) of QN101 is inputted to node NBIAS so that this input allows a constant current to flow through QN101.

The differential amplification circuit 107 is formed of transistors QP103, QP104, QP105, QN102 and QN103 and has nodes N101 and N103 as input terminals, and node N107 as an output terminal. In the case that the level of node N103 is higher than that of node N101, logic potential "L" is generated at node N107 and, on the other hand, in the case that the level of node N103 is lower than that of node N101, logic potential "H" is generated.

One end of resistor element R101 is connected to node NBGRA and the other end is connected to node N101. One end of resistor element R102 is connected to node N101 and the other end is connected to node N102. One end of resistor element R103 is connected to node NBGRA and the other end is connected to node N103.

The P type diffusion region of diode Di101 is connected to node N103 and the N type diffusion region is connected to ground voltage VSS. The P type diffusion region of diode Di102 is connected to node N102 and the N type diffusion region is connected to ground voltage VSS.

The output voltage VREF at node NBGRA of the band gap reference circuit, shown in FIG. 11, is shown in the following equation (equation 1-1) when the threshold voltage of diode Di101 is denoted as Vd, the resistance values of resistor elements R101, R102 and R103, respectively, are rs11, rs12 and rs13 and the saturation currents of diodes Di101 and Di102, respectively, are Is11 and Is12.

$$VREF = Vd + (rs11/rs12)*(k/q)*ln\{(Is12/Is11)*(rs11/rs13)\}*T \quad \text{(equation 1-1)}$$

wherein the Boltzmann coefficient is denoted as k, the amount of charge of electrons is denoted as q and the absolute temperature is denoted as T.

Vd shown above is dependent on the temperature and has a negative inclination wherein the higher the temperature is, the lower Vd is, while, the lower the temperature is, the higher Vd is.

When the constant voltage portion of the first term, Vd, of the right-side member of (equation 1-1) is denoted as A1, the fluctuation portion thereof due to temperature is denoted as $\alpha T$, the constant voltage portion of the second term of the right-side member of (equation 1-1) is denoted as B1, and the fluctuation portion thereof due to temperature is denoted as $\beta T$, VREF is indicated in the following equation (equation 1-2).

$$VREF = A1 + B1 - \alpha T + \beta T \qquad \text{(equation 1-2)}$$

The configuration makes it possible to gain a constant reference voltage wherein the dispersion due to the process and to temperature is greatly reduced by setting the values of coefficient $\alpha$ and $\beta$, which are dependent on the temperature, to be equal to each other in (equation 1-2). Though in the present description the circuit configuration of FIG. 11 is used and is explained, other circuit configurations using diodes and register elements can be implemented.

FIG. 12 is a circuit diagram showing an example of divided voltage potential generation circuit 102.

One end of a register element RA101 is connected to power supply voltage VDD and the other end is connected to output node NHALA while one end of register element RA102 is connected to ground voltage VSS and the other end is connected to output node NHALA. The power supply voltage is divided according to a ratio of resistance values of RA101 and RA102 so as to be outputted from node NHALA.

As shown in FIGS. 10 to 12, a band gap reference circuit is, in some cases, used as reference potential generation circuit 101 in order to limit the dispersion of the detection level due to fluctuation in process parameters, or the like, to a small value in power supply voltage detection circuit 104. However, a slight dispersion occurs in the reference potential due to parasitic resistances and parasitic capacitances caused by the layout and due to fluctuation in process parameters inside of a wafer and among wafers. The dispersion in the power supply voltage detection voltage increases in proportion to the power supply voltage detection voltage and the reference potential. In the case that, for example, the ratio of the power supply voltage detection voltage to the reference voltage is 2 and the dispersion in the reference voltage is 50 mV, the dispersion in the power supply voltage detection voltage becomes 100 mV.

In addition, in the case that a differential amplification circuit, shown as 107 in FIG. 11, is used and in the case that, for example, a difference of 30 mV occurs between the threshold values of QP104 and QP105, a nominal difference of 30 mV occurs between nodes N101 and N103 so that a similar dispersion occurs in output node NBGRA, which becomes the reference potential. In the case that a difference occurs between the threshold values of QN102 and QN103, dispersion occurs in output node NBGRA.

In particular, in the case that the values of the communication distance and the power supply voltage become of a tradeoff relationship so that the necessity of tolerance in the low voltage operation increases, such as in a non-contact IC card, reduction of this dispersion becomes important.

Even though fluctuation in the detection voltage level due to temperature variation and due to dispersion in the process can be reduced according to the conventional circuit configuration, it is difficult to correct, in each product, the fluctuation in the detection voltage among respective products caused by process dispersion in the same diffusion lot and in the same wafer, in particular, in the threshold value dispersion among the transistors and it is difficult to adjust the detection voltage level after completion of diffusion and after completion of assembly.

SUMMARY OF THE INVENTION

An object of the present invention is to provide a voltage detection level correction circuit and a semiconductor device wherein the power supply detection level can be varied after completion of diffusion as well as after completion of assembly so that it becomes possible to limit the dispersion in the power supply voltage detection level for products to a low level.

A voltage detection level correction circuit of the present invention comprises:

a power supply voltage detection circuit having a reference potential generation circuit for generating a constant reference potential that is independent of the power supply voltage, a divided voltage potential generation circuit for generating a divided potential gained by dividing the above described power supply voltage according to a constant ratio and a differential amplification circuit for comparing the above described reference potential with the above described divided voltage potential and for outputting an output signal in the case that the above described divided potential is lower than the above described reference potential;

a non-volatile memory which stores correction data for correcting the above described reference potential and which is converted to the inactive condition in response to the above described output signal of the above described differential amplification circuit;

a data latch circuit for storing the above described correction data read out from the above described non-volatile memory; and a control circuit for reading out the above described correction data, which is latched to the above described data latch circuit, from the above described non-volatile memory, and the voltage detection level correction circuit is characterized in that the above described reference potential generation circuit comprises a circuit which has circuit elements for varying the above described reference potential and which allows the above described correction data to be inputted from the above described data latch circuit for switching of the above described circuit elements.

According to the configuration of this invention, the reference potential can be arbitrarily varied after completion of diffusion and assembly and, therefore, the detection level of the power supply voltage detection circuit can be arbitrarily varied with respect to a product after diffusion and assembly, and it becomes possible to limit the dispersion of the power supply voltage detection level for products to a low level.

In the above described invention, the resistance value of a resistance element existing within the reference potential generation circuit may be altered according to correction data and, thereby, the reference potential is altered.

In addition, in the above described invention, the saturation current value of a diode element existing within the reference potential generation circuit may be altered according to correction data and, thereby, the reference potential is altered.

In the above described invention, the reference potential generation circuit may have a differential amplification circuit formed of transistors and the size of a transistor, of which the gate is connected to an input terminal of the differential amplification circuit, may be altered according to correction data and, thereby, the reference potential is altered.

In the above described invention, the reference potential generation circuit may have a differential amplification circuit that includes a current mirror circuit formed of transistors and the mirror ratio of the current mirror circuit may be altered according to correction data and, thereby, the reference potential is altered.

In the above described invention, at least two, or more, parameters from among the resistance value of the resistance element existing within the reference potential generation circuit, the saturation current value of a diode element existing within the reference potential generation circuit, the size of a transistor of which the gate is connected to an input terminal of a differential amplification circuit formed of transistors existing within the reference potential generation circuit and the mirror ratio of a current mirror circuit in a differential amplification circuit formed of transistors existing within the reference potential generation circuit, may be altered according to correction data and, thereby, the reference potential may be altered.

The above described invention may be characterized in that the above described control circuit operates in response to an output signal of the above described differential amplifier.

According to another aspect of the invention, a voltage detection level correction circuit comprises:

a power supply voltage detection circuit having a reference potential generation circuit for generating a constant reference potential that is independent of the power supply voltage, a divided voltage potential generation circuit for generating a divided potential gained by dividing said power supply voltage according to a constant ratio and a differential amplification circuit for comparing the above described reference potential with the above described divided voltage potential and for outputting an output signal in the case that the above described divided potential is lower than the above described reference potential;

a non-volatile memory which stores correction data for correcting a divided voltage potential in the above described divided voltage potential generation circuit and which is converted to the inactive condition in response to the above described output signal of the above described differential amplification circuit;

a data latch circuit for storing correction data read out from the above described non-volatile memory; and a control circuit for reading out the above described correction data, which is latched to the above described data latch circuit, from the above described non-volatile memory, and the voltage detection level correction circuit is characterized in that the above described divided voltage potential generation circuit comprises a circuit which has circuit elements for varying the above described divided voltage potential and which allows the above described correction data to be inputted from the above described data latch circuit for switching of the above described circuit elements.

According to the above described configuration, the divided voltage potential can be arbitrarily varied after diffusion and assembly and, therefore, the power supply detection level can be varied after completion of diffusion and assembly, and it becomes possible to limit the dispersion in the power supply voltage detection level for products to a low level.

The above described invention may be characterized in that the above described control circuit operates in response to an output signal of the above described differential amplifier.

According to yet another aspect of the invention a voltage detection level correction circuit comprises:

a power supply voltage detection circuit having a reference potential generation circuit for generating a constant reference potential that is independent of the power supply voltage, a divided voltage potential generation circuit for generating a divided potential gained by dividing the above described power supply voltage according to a constant ratio and a differential amplification circuit for comparing the above described reference potential with the above described divided voltage potential and for outputting an output signal in the case that the above described divided potential is lower than the above described reference potential;

a non-volatile memory which stores correction data for adjusting the sensitivity of the above described differential amplification circuit and which is converted to the inactive condition in response to the above described output signal of the above described differential amplification circuit;

a data latch circuit for storing correction data read out from the above described non-volatile memory; and a control circuit for reading out the above described correction data, which is latched to the above described data latch circuit, from the above described non-volatile memory, and the voltage detection level correction circuit is characterized in that the above described differential amplification circuit comprises a circuit which has circuit elements for adjusting the sensitivity of the above described differential amplification circuit so that the voltage detection level can be corrected and which allows the above described correction data to be inputted from the above described data latch circuit for switching of the above described circuit elements.

According to the above described configuration, the sensitivity of the differential amplification circuit can be arbitrarily adjusted after diffusion and assembly and, therefore, the power supply detection level can be varied after completion of diffusion and assembly, and it becomes possible to limit the dispersion in the power supply voltage detection level for products to a low level.

The above described invention may be characterized in that the above described control circuit operates in response to an output signal of the above described differential amplifier.

According to a further aspect of the invention a voltage detection level correction circuit of the present invention comprises:

a power supply voltage detection circuit having a reference potential generation circuit for generating a constant reference potential that is independent of the power supply voltage, a divided voltage potential generation circuit for generating a divided potential gained by dividing the above described power supply voltage according to a constant ratio and a differential amplification circuit for comparing the above described reference potential with the above described divided voltage potential and for outputting an output signal in the case that the above described divided potential is lower than the above described reference potential;

a non-volatile memory which stores correction data for correcting the above described reference potential, correction data for correcting a divided voltage potential in the above described divided voltage potential generation circuit or correction data for adjusting the sensitivity of the above described differential amplification circuit and which is converted to the inactive condition in response to the above described output signal of the above described differential amplification circuit;

a data latch circuit for storing correction data read out from the above described non-volatile memory; and a control circuit for reading out the above described correction data, which is latched to said data latch circuit, from the above described non-volatile memory, and the voltage detection level correction circuit is characterized in that at least two, or more, circuits from among the above described reference potential generation circuit, the above described divided voltage potential generation circuit and the above described differential amplifier comprise circuits which have circuit elements for varying the above described reference potential, the above described divided voltage potential or the sensitivity of the above described differential amplification circuit and which allows the above described correction data to be inputted from the above described data latch circuit for switching of the above described circuit elements.

According to the above described configuration, a semiconductor device can be provided on which a voltage detection level correction circuit that can arbitrarily vary the voltage detection level is mounted so that it becomes possible to limit dispersion in the power supply voltage detection level for products to a low level.

The above described configuration may be characterized in that the above described control circuit operates in response to an output signal of the above described differential amplifier.

A voltage detection level correction circuit having the above described configuration may be mounted on a semiconductor device.

DESCRIPTION OF THE PREFERRED EMBODIMENTS

Figure 1:
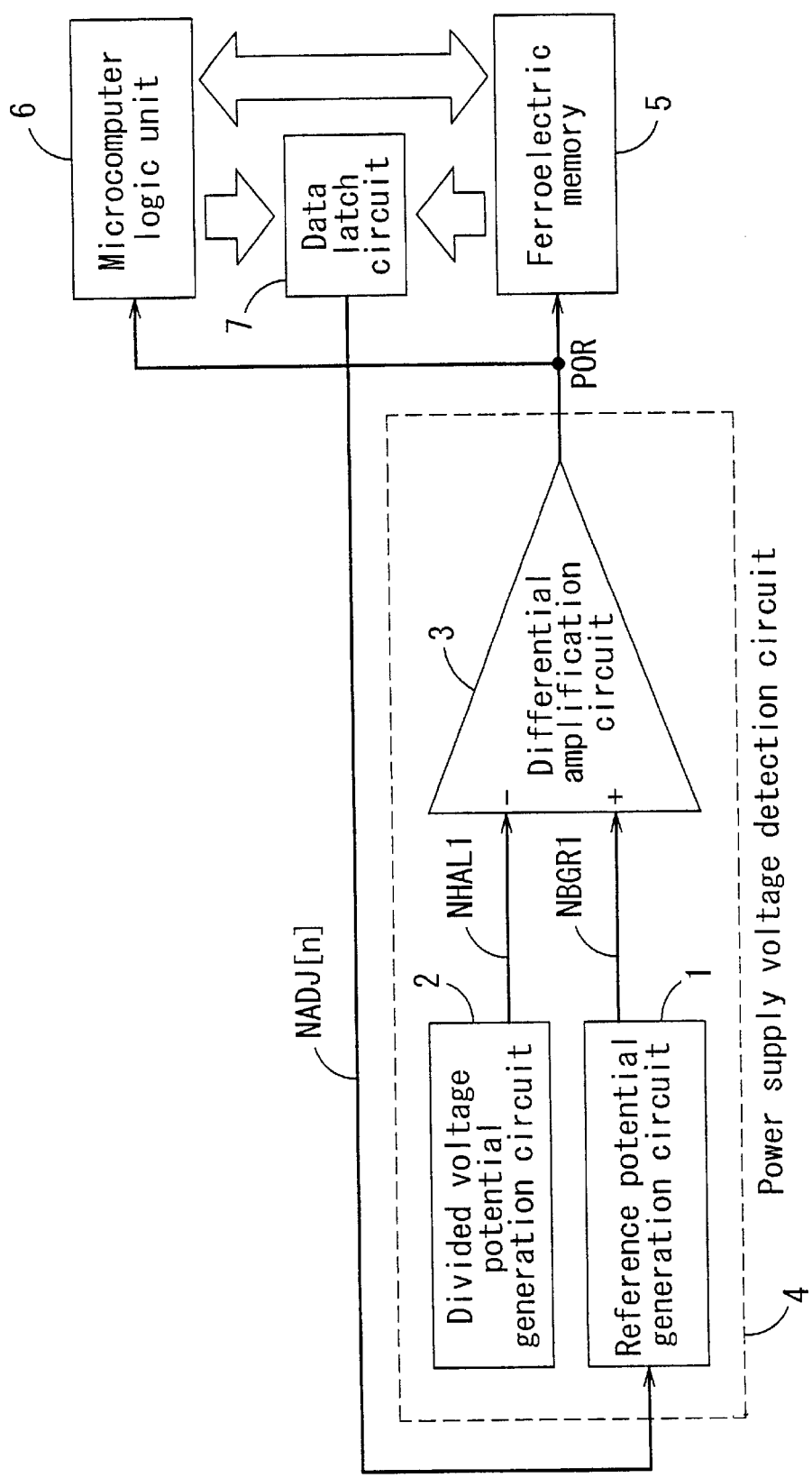
FIG. 1 is a block diagram of a semiconductor device having a detection voltage level correction circuit according to the first embodiment of the present invention.

FIG. 1 shows a block diagram of a semiconductor device on which a voltage detection level correction circuit according to the first embodiment of the present invention is mounted.

A reference potential generation circuit represented by a band gap reference circuit that generates a constant reference, which is independent of the power supply voltage, is denoted as 1 and an output node that generates reference voltage level VBGR1 is denoted as NBGR1. A divided voltage potential generation circuit for generating a divided voltage level, which is dependent on the power supply voltage, is denoted as 2 and an output node that generates divided voltage level VHAL1 is denoted as NHAL1. A differential amplification circuit for generating a comparison output POR by comparing output signal potential level VBGR1 and the potential level of VHAL1 is denoted as 3. In the case that the power supply voltage is no greater than the set voltage, that is to say, in the case that reference voltage level VBGR1 is higher than divided voltage level VHAL1, output signal POR outputs logic level "H" and converts a microcomputer logic unit 6 and a ferroelectric memory 5 to the inactive condition. In addition, in the case that the power supply voltage is no less than the set voltage, that is to say, in the case that reference potential VBGR1 is lower than VHAL1, output signal POR outputs logic level "L" and converts microcomputer logic unit 6 and a ferroelectric memory 5 to the active condition. A power supply voltage detection circuit formed of reference potential generation circuit 1, divided voltage potential generation circuit 2 and differential amplification circuit 3 is denoted as 4. A non-volatile ferroelectric memory for storing arbitrary information is denoted as 5. A microcomputer logic unit for controlling ferroelectric memory 5 and a data latch circuit 7 is denoted as 6. A data latch circuit for storing data read out from ferroelectric memory 5 and for storing output signal NADJ[n] utilized for correction of reference voltage level VBGR1 is denoted as 7.

Figure 12:
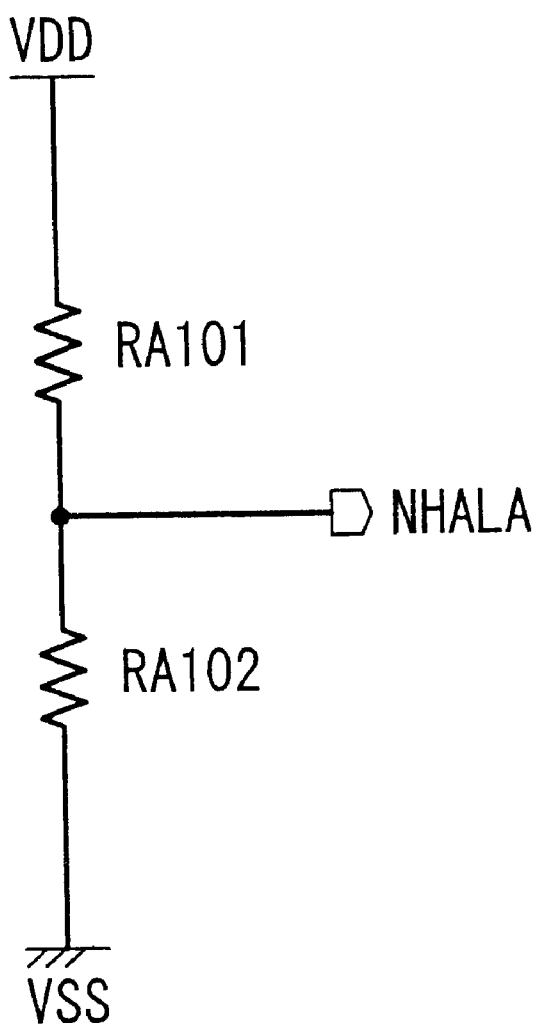
FIG. 12 is a diagram of a divided voltage potential generation circuit according to a prior art.

In addition, in the following description it is assumed that the circuit (FIG. 12) described above as a conventional circuit is used for divided voltage potential generation circuit 2 in FIG. 1.

Figure 2:
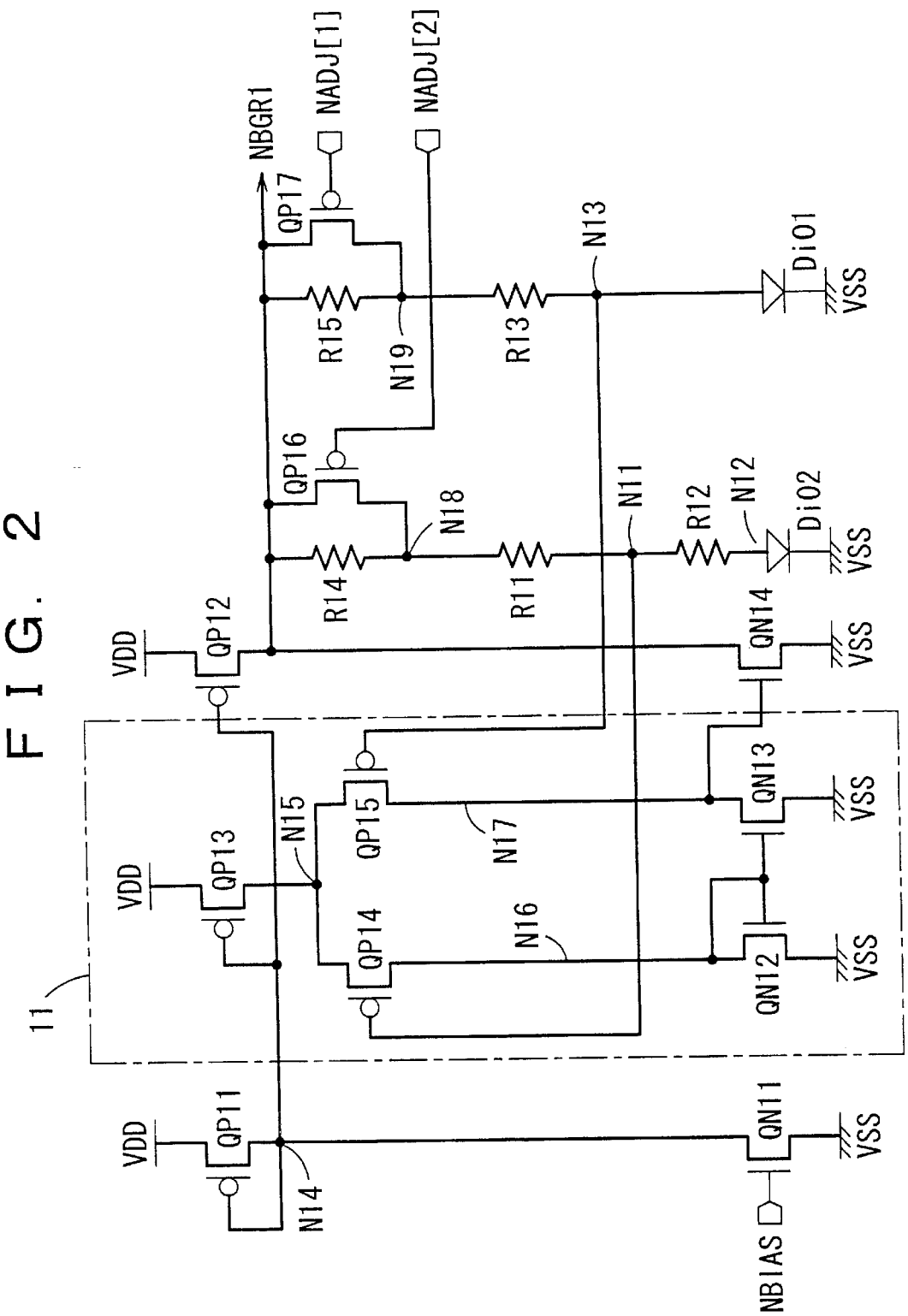
FIG. 2 is a diagram of a reference potential generation circuit in the detection voltage level correction circuit according to the first embodiment.

FIG. 2 shows an example of reference potential generation circuit 1 according to the first embodiment of the present invention.

Though in the present circuit diagram the data correction signal is shown using two signals, NADJ[1] and NADJ[2], for the purpose of simplification, the number of data correction signals NADJ[n] can, of course, be increased so that a resistance value for adjustment can be further divided into smaller values. Accordingly, it becomes possible to combine two, or more, parallel circuits of resistors and transistors that are, respectively, connected in series to resistor R11 and resistor R13 and, thereby, to divide the resistance value for adjustment into smaller values.

P channel type MOS transistors are denoted as QP11, QP12, QP13, QP14, QP15, QP16 and QP17, N channel type MOS transistors are denoted as QN11, QN12, QN13 and QN14, resistance elements are denoted as R11, R12, R13, R14 and R15, a differential amplification circuit for amplifying the potential difference between internal nodes N11 and N13 formed of the above described transistors QP13, QP14, QP15, QN12 and QN13 is denoted as 11, diodes are denoted as Di01 and Di02, the power supply voltage is denoted as VDD and the ground voltage is denoted as VSS.

The source of P channel type MOS transistor QP11 is connected to power supply voltage VDD and the gate and drain, respectively, are connected to node N14. The source of P channel type MOS transistor QP12 is connected to power supply voltage VDD, the gate is connected to node N14 and the drain is connected to output node NBGR1. The source of P channel type MOS transistor QP13 is connected to power supply voltage VDD, the gate is connected to node N14 and the drain is connected to N15. The source of P channel type MOS transistor QP14 is connected to N15, the gate is connected to node N11 and the drain is connected to N16. The source of P channel type MOS transistor QP15 is connected to N15, the gate is connected to node N13 and the drain is connected to N17. The source of P channel type MOS transistor QP16 is connected to node NBGR1, the gate is connected to node NADJ[2] and the drain is connected to N18. The source of P channel type MOS transistor QP17 is connected to NBGR1, the gate is connected to node NADJ[1] and the drain is connected to N19.

The gate of N channel type MOS transistor QN11 is connected to node NBIAS, the source is connected to ground voltage VSS and the drain is connected to node N104. The gate and the drain of N channel type MOS transistor QN12 are connected to node N16 and the source is connected to ground voltage VSS. The gate of N channel type MOS transistor QN13 is connected to node N16, the source is connected to ground voltage VSS and the drain is connected to node N17. The gate of N channel type MOS transistor QN14 is connected to node N17, the source is connected to ground voltage VSS and the drain is connected to node NBGRA.

As for the potential supplied to node NBIAS, a potential slightly higher than the threshold value (Vt) of N channel type MOS transistor QN11 is inputted in the same manner as in the conventional circuit so that the input allows a constant current to flow through N channel type MOS transistor QN11.

Differential amplification circuit 11 is formed of the above described transistors QP13, QP14, QP15, QN12 and QN13, wherein nodes N11 and N13 become input terminals and node N17 becomes an output terminal. In the case that the level of node N13 is higher than that of node N11, logic potential "L" is generated at node N17 and, on the other hand, in the case that the level of node N13 is lower than that of node N11, logic potential "H" is generated at node N17.

One end of resistance element R11 is connected to node N18 and the other end is connected to node N11. One end of resistance element R12 is connected to node N11 and the other end is connected to node N12. One end of resistance element R13 is connected to node N19 and the other end is connected to node N13. One end of resistance element R14 is connected to node NBGR1 and the other end is connected to node N18. One end of resistance element R15 is connected to node NBGR1 and the other end is connected to node N19.

The P type diffusion region of diode Di01 is connected to node N13 and the N type diffusion region is connected to ground voltage VSS. The P type diffusion region of diode Di02 is connected to node N12 and the N type diffusion region is connected to ground voltage VSS.

In addition, the sizes of the transistors are set so that the resistance values of the transistors at the time when QP16 and QP17 become of the ON condition do not have any influence, in comparison with the resistance values of resistors R11, R12, R13, R14 and R15.

In the case that correction signals NADJ[1] and NADJ[2] are both at the "H" logic level, for example, rs11 in equation (1-1) becomes the sum of the resistance values R11 and R14 while rs13 becomes the sum of the resistance values R13 and R15.

That is to say, the logic level of correction signal NADJ[n] allows changes in the resistance ratio of rs11 to rs13 and in the resistance ratio of rs11 to rs12 in equation (1-1) and the value of β in (equation 1-2) can be varied and, therefore, it becomes possible to vary the reference voltage and the power supply voltage detection voltage.

Figure 3:
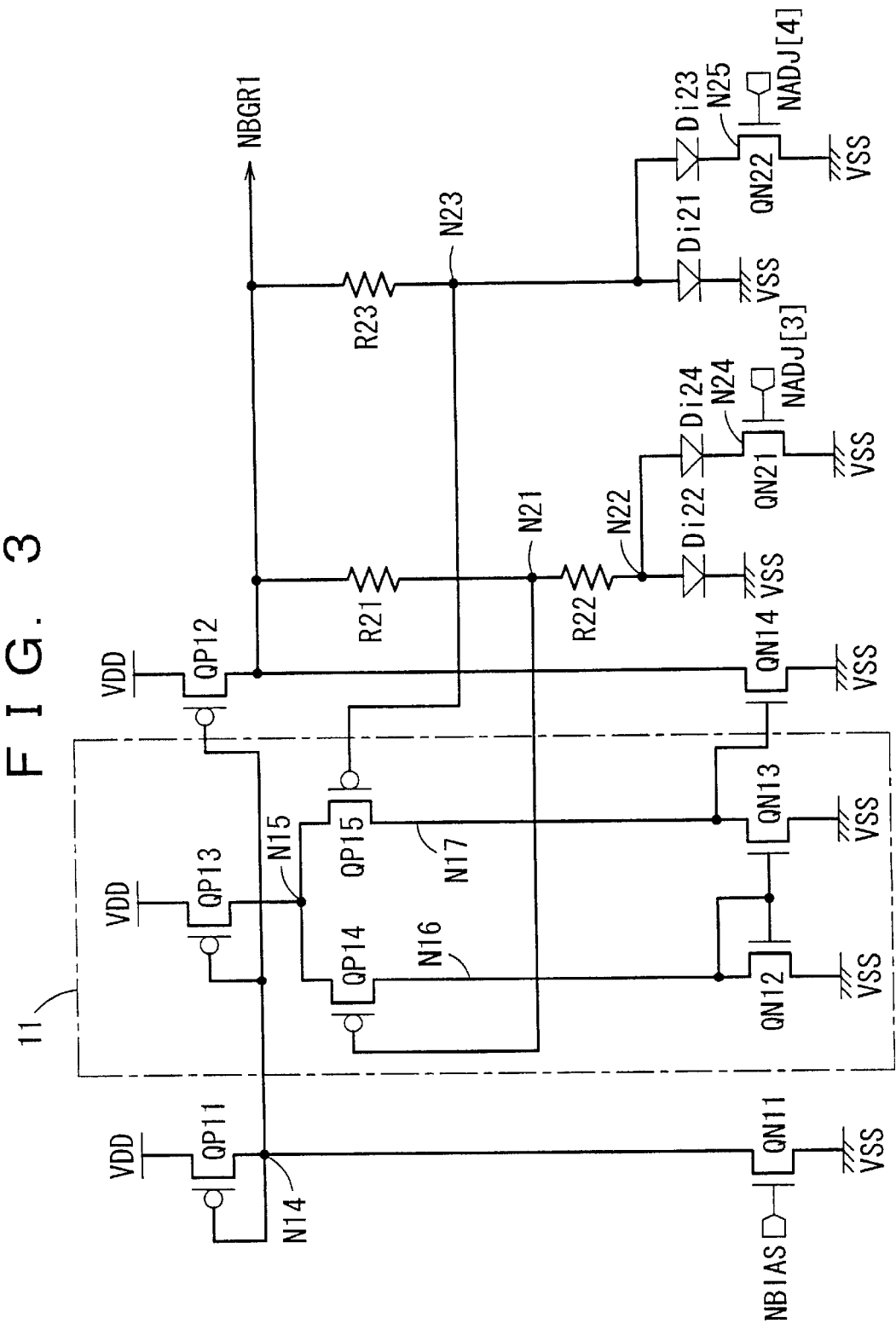
FIG. 3 is a diagram of a reference potential generation circuit in a detection voltage level correction circuit according to the second embodiment.

FIG. 3 shows a reference potential generation circuit according to the second embodiment of the present invention. Though in the present circuit diagram, data correction signals are shown using two signals, NADJ[3] and NADJ[4], for the purpose of simplification, the number of data correction signals NADJ[n] can, of course, be increased so that the value of the divided area of the diodes can further divided into smaller values. Accordingly, two, or more, series circuits of diodes and transistors can be combined so as to be, respectively, connected in parallel to diode Di21 and to Di22.

P channel type MOS transistors are denoted as QP11, QP12, QP13, QP14 and QP15, N channel type MOS transistors are denoted as QN11, QN12, QN13, QN14, QN21 and QN22, resistance elements are denoted as R21, R22 and R23, a differential amplification circuit for amplifying the potential difference between internal nodes N21 and N23 formed of the above described transistor QP13, QP14, QP15, QN12 and QN13 is denoted as 11, diodes are denoted as Di21, Di22, Di23 and Di24, the power supply voltage is denoted as VDD and the ground voltage is denoted as VSS.

The source of P channel type MOS transistor QP11 is connected to power supply voltage VDD and the gate and drain, respectively, are connected to node N14. The source of P channel type MOS transistor QP12 is connected to power supply voltage VDD, the gate is connected to node N14 and the drain is connected to node NBGR1. The source of P channel type MOS transistor QP13 is connected to power supply voltage VDD, the gate is connected to node N14 and the drain is connected to N15. The source of P channel type MOS transistor QP14 is connected to N15, the gate is connected to node N21 and the drain is connected to N16. The source of P channel type MOS transistor QP15 is connected to N15, the gate is connected to node N23 and the drain is connected to N17.

The gate of N channel type MOS transistor QN11 is connected to node NBIAS, the source is connected to ground voltage VSS and the drain is connected to node N14. The gate and the drain of N channel type MOS transistor QN12 are connected to node N16 and the source is connected to ground voltage VSS. The gate of N channel type MOS transistor QN13 is connected to node N16, the source is connected to ground voltage VSS and the drain is connected to node N17. The gate of N channel type MOS transistor QN14 is connected to node N17, the source is connected to ground voltage VSS and the drain is connected to node NBGR1.

The gate of N channel type MOS transistor QN21 is connected to node NADJ[3], the source is connected to ground voltage VSS and the drain is connected to node N24. The gate of N channel type MOS transistor QN22 is connected to node NADJ[4], the source is connected to ground voltage VSS and the drain is connected to node N25.

As for the potential supplied to node NBIAS, a potential slightly higher than the threshold value (Vt) of N channel type MOS transistor QN11 is inputted in the same manner as in the conventional circuit so that the input allows a constant current to flow through N channel type MOS transistor QN11.

Differential amplification circuit 11 is formed of the above described transistors QP13, QP14, QP15, QN12 and QN13, wherein nodes N21 and N23 become input terminals and node N17 becomes an output terminal. In the case that the level of node N23 is higher than that of node N21, logic potential "L" is generated at node N17 and, on the other hand, in the case that the level of node N23 is lower than that of node N21, logic potential "H" is generated at node N17.

One end of resistance element R21 is connected to node NBGR1 and the other end is connected to node N21. One end of resistance element R22 is connected to node N21 and the other end is connected to node N22. One end of resistance element R23 is connected to node NBGR1 and the other end is connected to node N23.

The P type diffusion region of diode Di21 is connected to node N23 and the N type diffusion region is connected to ground voltage VSS. The P type diffusion region of diode Di22 is connected to node N22 and the N type diffusion region is connected to ground voltage VSS. The P type diffusion region of diode Di23 is connected to node N23 and the N type diffusion region is connected to node N25. The P type diffusion region of diode Di24 is connected to node N22 and the N type diffusion region is connected to node N24.

In addition, the sizes of the transistors are set so that the resistance values of the transistors at the time when QP21 and QP22 become of the ON condition do not have any influence, in comparison with the parasitic resistance of the diodes.

In the case that correction signals NADJ[3] and NADJ[4] are both at the "H" logic level, for example, Is11 in equation (1-1) becomes the saturation current value of the total areas of Di21 and Di23, and Is12 becomes the saturation current value of the total area of Di22 and Di24.

That is to say, the logic level of correction signals NADJ[n] allow alteration of the current ratio of Is11 to Is12 in equation (1-1), and the value of β in (equation 1-2) can be varied so that it becomes possible to vary the reference voltage and the power supply voltage detection voltage.

Figure 4:
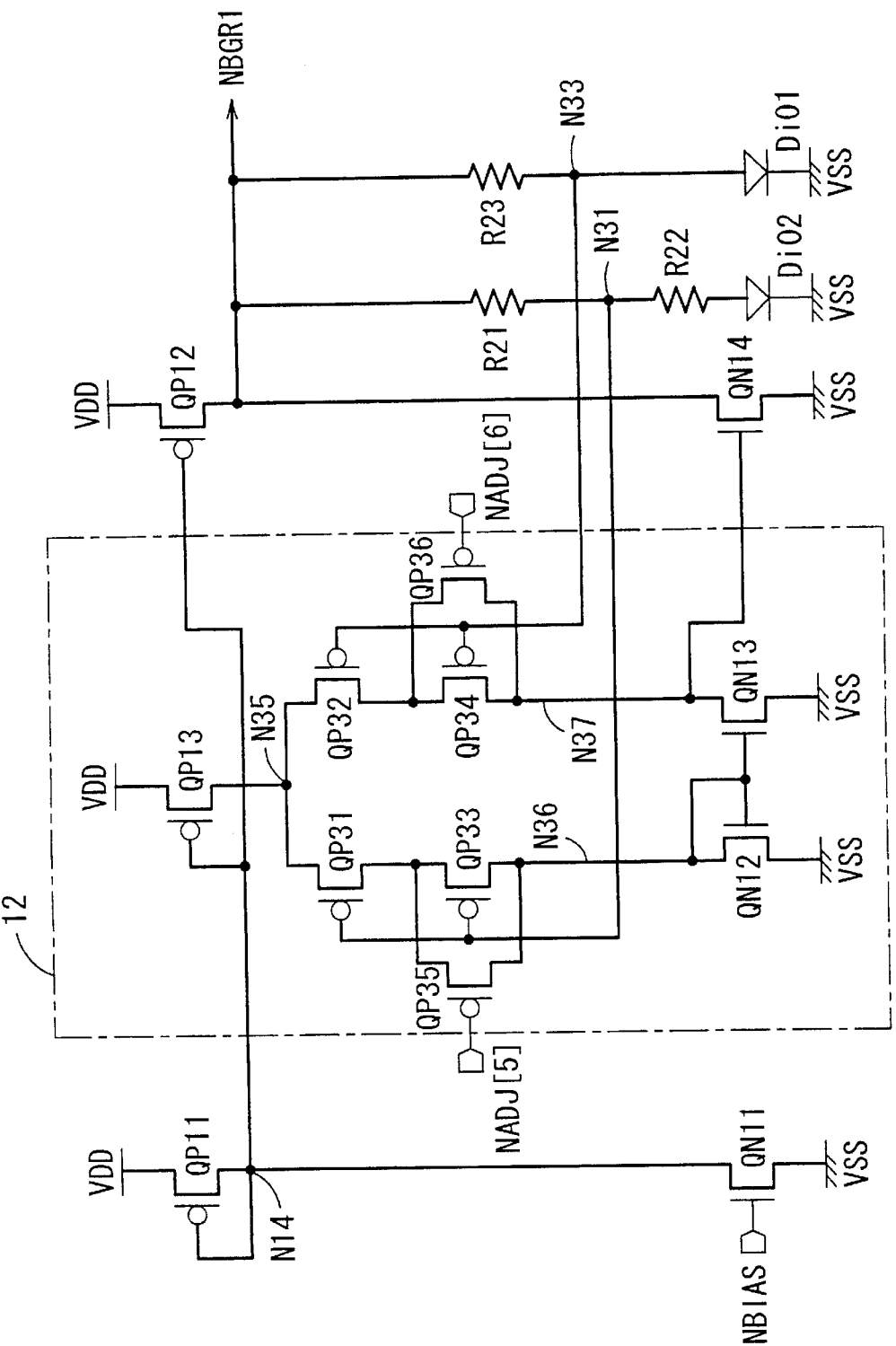
FIG. 4 is a diagram of a reference potential generation circuit in a detection voltage level correction circuit according to the third embodiment.

FIG. 4 shows a reference potential generation circuit according to the third embodiment of the present invention.

Though in the present circuit diagram the data correction signals are shown using two signals, NADJ[5] and NADJ[6], for the purpose of simplification, the number of data correction signals NADJ[n] can, of course, be increased so that, in regard to the amount of division, the size of the transistors can be further divided into smaller amounts.

Accordingly, two, or more, parallel circuits having one pair of transistors are combined so as to be connected in series to transistors QP31 and QP32, respectively, and the gate of one transistor in each circuit can be connected to the gates of transistors QP31 and QP32.

P channel type MOS transistors are denoted as QP11, QP12, QP13, QP31, QP32, QP33 QP34, QP35 and QP36, N channel type MOS transistors are denoted as QN11, QN12, QN13 and QN14, resistance elements are denoted as R21, R22 and R23, a differential amplification circuit for amplifying the potential difference between internal nodes N31 and N33 formed of the above described transistors QP13, QP31, QP32, QP33, QP34, QP35, QN12 and QN13 is denoted as 12, diodes are denoted as Di01 and Di02, the power supply voltage is denoted as VDD and the ground voltage is denoted as VSS.

The source of P channel type MOS transistor QP11 is connected to power supply voltage VDD and the gate and drain, respectively, are connected to node N14. The source of P channel type MOS transistor QP12 is connected to power supply voltage VDD, the gate is connected to node N14 and the drain is connected to NBGR1. The source of P channel type MOS transistor QP13 is connected to power supply voltage VDD, the gate is connected to node N14 and the drain is connected to N35. The source of P channel type MOS transistor QP31 is connected to N35, the gate is connected to node N31 and the drain is connected to N38. The source of P channel type MOS transistor QP32 is connected to N35, the gate is connected to node N33 and the drain is connected to N39. The source of P channel type MOS transistor QP33 is connected to N38, the gate is connected to node N31 and the drain is connected to N36. The source of P channel type MOS transistor QP34 is connected to N39, the gate is connected to node N33 and the drain is connected to N37. The source of P channel type MOS transistor QP35 is connected to N38, the gate is connected to node NADJ[5] and the drain is connected to N36. The source of P channel type MOS transistor QP36 is connected to N39, the gate is connected to node NADJ[6] and the drain is connected to N37.

In addition, the resistance values of transistors QP35 and QP36, in the case that they are in the active condition, are set so as not to have any influence, in comparison with the resistance values in the case that transistors QP33 and QP34 are activated.

The gate of N channel type MOS transistor QN11 is connected to node NBIAS, the source is connected to ground voltage VSS and the drain is connected to node N14. The gate and the drain of N channel type MOS transistor QN12 are connected to node N36 and the source is connected to ground voltage VSS. The gate of N channel type MOS transistor QN13 is connected to node N36, the source is connected to ground voltage VSS and the drain is connected to node N37. The gate of N channel type MOS transistor QN14 is connected to node N37, the source is connected to ground voltage VSS and the drain is connected to node NBGR1.

As for the potential supplied to node NBIAS, a potential slightly higher than the threshold value (Vt) of QN11 is inputted in the same manner as in the conventional circuit so that the input allows a constant current to flow through QN11.

Differential amplification circuit 12 is formed of the above described transistors QP13, QP31, QP32, QP33, QP34, QP35, QP36, QN12 and QN13, wherein nodes N31 and N33 become input terminals and node N37 becomes an output terminal. In the case that the level of node N33 is higher than that of node N31, logic potential "L" is generated at node N37 and, on the other hand, in the case that the level of node N33 is lower than that of node N31, logic potential "H" is generated at node N37.

One end of resistance element R21 is connected to node NBGR1 and the other end is connected to node N31. One end of resistance element R22 is connected to node N31 and the other end is connected to node N32. One end of resistance element R23 is connected to node NBGR1 and the other end is connected to node N33.

The P type diffusion region of diode Di01 is connected to node N33 and the N type diffusion region is connected to ground voltage VSS. The P type diffusion region of diode Di02 is connected to node N32 and the N type diffusion region is connected to ground voltage VSS.

The sizes of the transistors having gates to which the nodes N31 and N33 are connected are changed, that is to say, it becomes possible to vary the threshold values of the transistors in the case that, for example, correction signal NADJ[5] is at the "H" logic level and NADJ[6] is at the "L" logic level and, therefore, adjustment becomes possible even in the case of dispersion in the threshold values of transistors QP31 and QP32.

Figure 5:
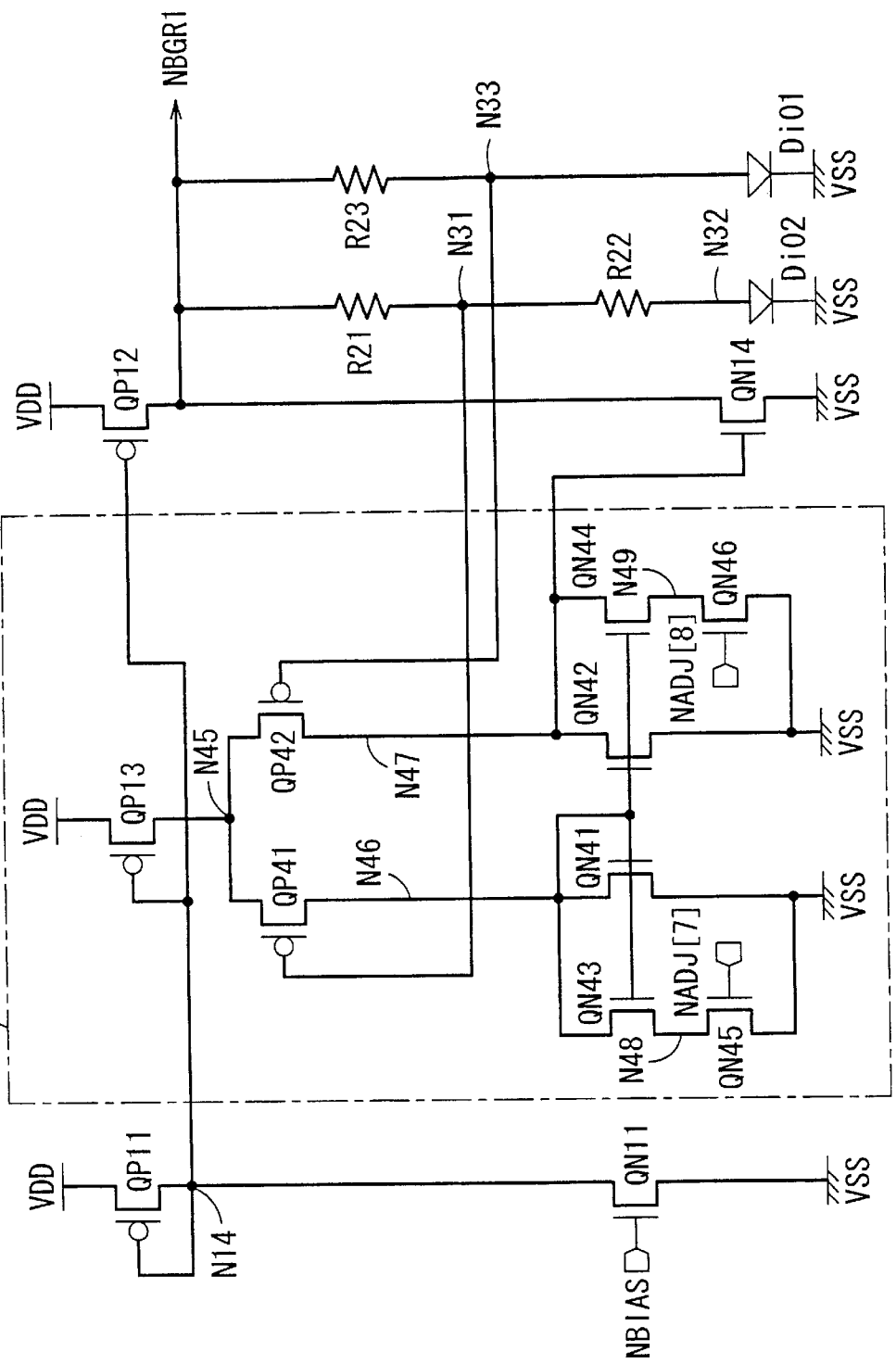
FIG. 5 is a diagram of a reference potential generation circuit in a detection voltage level correction circuit according to the fourth embodiment.

FIG. 5 shows a reference potential generation circuit according to the fourth embodiment of the present invention.

Though in the present circuit diagram the data correction signals are shown using two signals, NADJ[7] and NADJ[8], for the purpose of simplification, the number of data correction signals NADJ[n] can, of course, be increased so that, in regard to the amount of division, the size of the transistors can be further divided into smaller amounts. Accordingly, two, or more, series circuits having one pair of transistors are combined so as to be connected in parallel to transistors QN41 and QN42, respectively, and the gate of one transistor in each circuit can be connected to the common gate of transistors QN41 and QN42.

P channel type MOS transistors are denoted as QP11, QP12, QP13, QP41 and QP42, N channel type MOS transistors are denoted as QN11, QN41, QN42 QN43, QN44, QN45, QN46 and QN14, resistance elements are denoted as R21, R22 and R23, a differential amplification circuit for amplifying the potential difference between internal nodes N31 and N33 formed of the above described transistors QP13, QP41, QP42, QN41, QN42, QN43, QN44, QN45 and QN46 is denoted as 13, diodes are denoted as Di01 and Di02, the power supply voltage is denoted as VDD and the ground voltage is denoted as VSS.

The source of P channel type MOS transistor QP11 is connected to power supply voltage VDD and the gate and drain, respectively, are connected to node N14. The source of P channel type MOS transistor QP12 is connected to power supply voltage VDD, the gate is connected to node N14 and the drain is connected to node NBGR1. The source of P channel type MOS transistor QP13 is connected to power supply voltage VDD, the gate is connected to node N14 and the drain is connected to N45. The source of P channel type MOS transistor QP41 is connected to N45, the gate is connected to node N31 and the drain is connected to N46. The source of P channel type MOS transistor QP42 is connected to N45, the gate is connected to node N33 and the drain is connected to N47.

The gate of N channel type MOS transistor QN11 is connected to node NBIAS, the source is connected to ground voltage VSS and the drain is connected to node N14. The gate and the drain of N channel type MOS transistor QN41 are connected to node N46 and the source is connected to ground voltage VSS. The gate of N channel type MOS transistor QN42 is connected to node N46, the source is connected to ground voltage VSS and the drain is connected to node N47. The gate and the drain of N channel type MOS transistor QN43 are connected to node N46 and the source is connected to N48. The gate of N channel type MOS transistor QN44 is connected to node N46, the source is connected to node N49 and the drain is connected to node N47. The gate of N channel type MOS transistor QN45 is connected to node NADJ[7], the source is connected to ground voltage VSS and the drain is connected to node N48. The gate of N channel type MOS transistor QN46 is connected to node NADJ[8], the source is connected to ground voltage VSS and the drain is connected to node N49. The gate of N channel type MOS transistor QN14 is connected to node N47, the source is connected to ground voltage VSS and the drain is connected to node NBGR1.

In addition, the resistance values of N channel type MOS transistors QN45 and QN46, in the case that they are in the active condition, are set so as not to have any influence, in comparison with the resistance values in the case that N channel type MOS transistors QN43 and QN44 are activated.

As for the potential supplied to node NBIAS, a potential slightly higher than the threshold value (Vt) of N channel type MOS transistor QN11 is inputted in the same manner as in the conventional circuit so that the input allows a constant current to flow through N channel type MOS transistor QN11.

Differential amplification circuit 13 is formed of the above described transistors QP13, QP41, QP42, QN41, QN42, QN43, QN44, QN45 and QN46 wherein nodes N31 and N33 become input terminals and node N47 becomes an output terminal. In the case that the level of node N33 is higher than that of node N31, logic potential "L" is generated at node N47 and, on the other hand, in the case that the level of node N33 is lower than that of node N31, logic potential "H" is generated at node N47.

One end of resistance element R21 is connected to node NBGR1 and the other end is connected to node N31. One end of resistance element R22 is connected to node N31 and the other end is connected to node N32. One end of resistance element R23 is connected to node NBGR1 and the other end is connected to node N33.

The P type diffusion region of diode Di01 is connected to node N33 and the N type diffusion region is connected to ground voltage VSS. The P type diffusion region of diode Di02 is connected to node N32 and the N type diffusion region is connected to ground voltage VSS.

The sizes of the transistors forming a current mirror circuit are changed, that is to say, it becomes possible to vary the threshold values of the transistors in the case that, for example, correction signal NADJ[7] is at the "H" logic level and NADJ[8] is at the "L" logic level and, thereby, adjustment becomes possible even in the case of dispersion in the threshold values of transistors QN41 and QN42.

Here, though the first to fourth embodiments are separately described above, it is possible to implement two, or more, types of the above embodiments in combination and the effects of adjustment in the voltage detection level can, of course, be gained.

Figure 6:
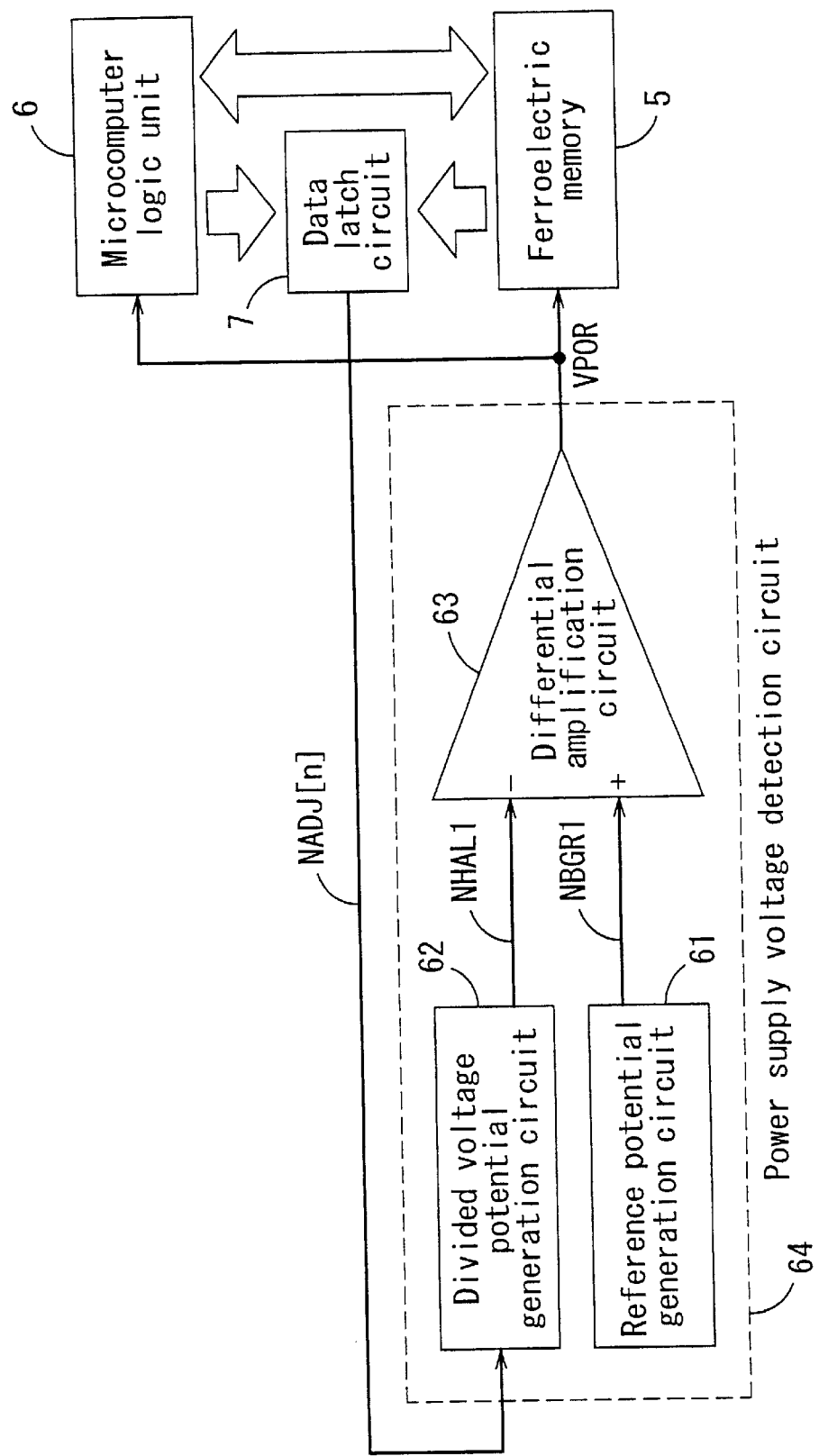
FIG. 6 is a block diagram of a semiconductor device having a detection voltage level correction circuit according to the fifth embodiment of the present invention.

FIG. 6 shows a semiconductor device having a voltage detection level correction circuit according to the fifth embodiment of the present invention.

A reference potential generation circuit represented by a band gap reference circuit is denoted as 61 and an output node for generating reference voltage level VBGR1 is denoted as NBGR1. A divided voltage potential generation circuit for generating a divided voltage level that is independent of the power supply voltage is denoted as 62 and an output node for generating divided voltage level VHAL1 is denoted as NHAL1. A differential amplification circuit for comparing output signal voltage level VBGR1 to potential level VHAL1 so as to generate a comparison output VPOR is denoted as 63. In the case that the power supply voltage is no greater than the set voltage, that is to say, in the case that reference potential VBGR1 is higher than divided voltage potential VHAL1, output signal VPOR outputs the "H" logic level and converts microcomputer logic unit 6 and ferroelectric memory 5 to the inactive condition. In addition, in the case that the power supply voltage is no less than the set voltage, that is to say, in the case that reference potential VBGR1 is lower than divided voltage potential VHAL1, output signal VPOR outputs the "L" logic level and converts microcomputer logic unit 6 and ferroelectric memory 5 to the active condition. A power supply voltage detection circuit formed of reference potential generation circuit 61, divided voltage potential generation circuit 62 and differential amplification circuit 63 is denoted as 64.

A ferroelectric memory for storing arbitrary information is denoted as 5. A microcomputer logic unit for controlling the ferroelectric memory is denoted as 6. A data latch circuit for storing data read out from ferroelectric memory 5 and for storing output signals NADJ[n] utilized for correction of divided voltage potential VHAL1 is denoted as 7.

Figure 11:
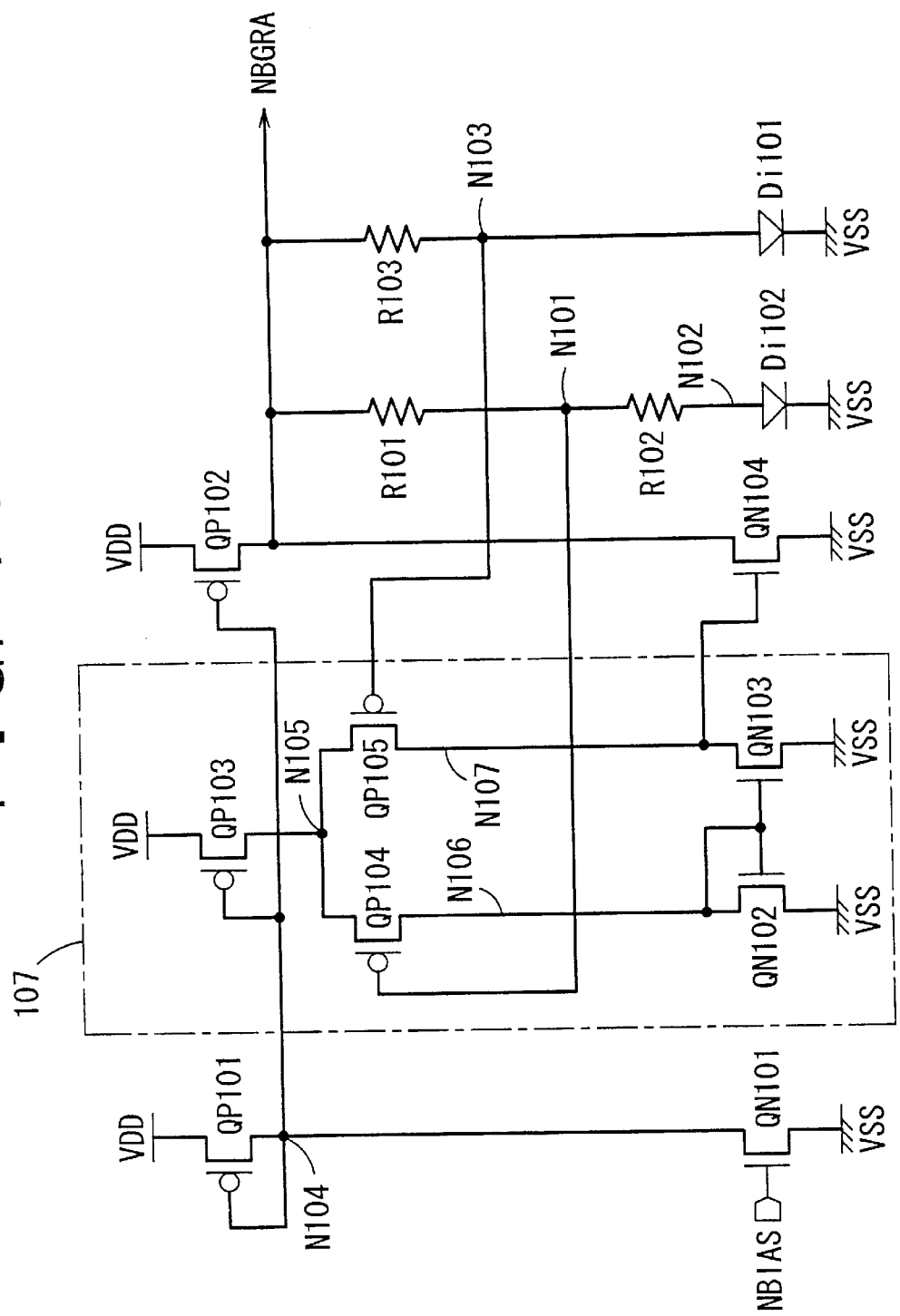
FIG. 11 is a diagram of a reference potential generation circuit according to a prior art.

In addition, in the following description it is assumed that the circuit (FIG. 11) described as the conventional circuit is used for reference potential generation circuit 61 in FIG. 6.

Figure 7:
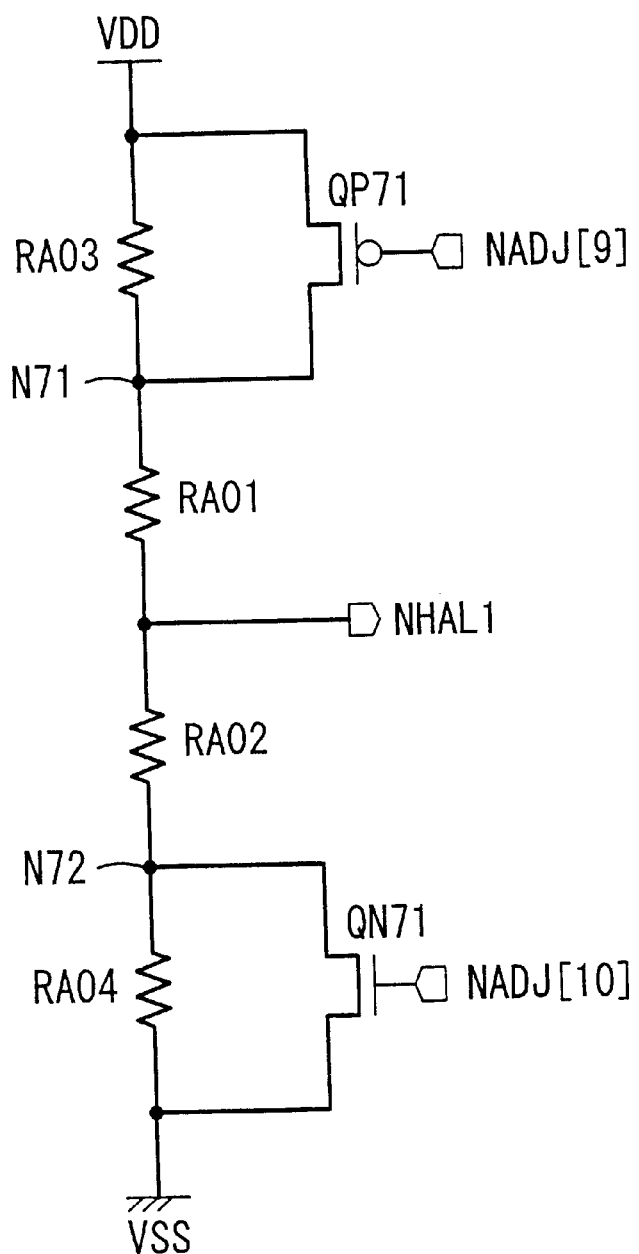
FIG. 7 is a diagram of a divided voltage potential generation circuit in a detection voltage level correction circuit according to the fifth embodiment.

FIG. 7 shows a divided voltage potential generation circuit according to the fifth embodiment of the present invention.

Though in the present circuit diagram the data correction signals are shown using two signals, NADJ[9] and NADJ[10], for the purpose of simplification, the number of data correction signals NADJ[n] can, of course, be increased so that the resistance value for adjustment can be further divided into smaller values. Accordingly, two, or more, parallel circuits of resistors and transistors are combined so as to be connected in series to resistors RA01 and RA02, respectively.

A P channel type MOS transistor is denoted as QP71, an N channel type MOS transistor is denoted as QN71, resistance elements are denoted as RA01, RA02, RA03 and RA04, the power supply voltage is denoted as VDD and the ground voltage is denoted as VSS.

One end of resistance element RA03 is connected to power supply voltage VDD and the other end is connected to node N71. One end of resistance element RA01 is connected to node N71 and the other end is connected to node NHAL1. One end of resistance element RA02 is connected to node N72 and the other end is connected to node NHAL1. One end of resistance element RA04 is connected to ground voltage VSS and the other end is connected to output node N72.

The source of P channel type MOS transistor QP71 is connected to power supply voltage VDD, the gate is connected to node NADJ[9] and the drain is connected to node N71.

The gate of N channel type MOS transistor QN71 is connected to node NADJ[10], the source is connected to ground voltage VSS and the drain is connected to node N72.

The resistance values of transistors QN71 and QP71 at the time when they are activated are set so as not to have any influence in comparison with the resistance values of resistance elements RA01, RA02, RA03 and RA04.

In the case that, for example, NADJ[9] is logically at "L" and NADJ[10] is logically at "H", divided voltage potential NHAL1 is divided according to the ratio of resistance value RA01 to resistance value RA02. In addition, in the case that NADJ[9] is logically at "H" and NADJ[10] is logically at "H", divided voltage potential NHAL1 is divided according to the ratio of the sum of resistance values RA01 and RA03 to resistance value RA02.

Accordingly, adjustment of the divided voltage potential becomes possible according to the conditions of NADJ[n] and, therefore, it becomes possible to vary the voltage detection level.

Figure 8:
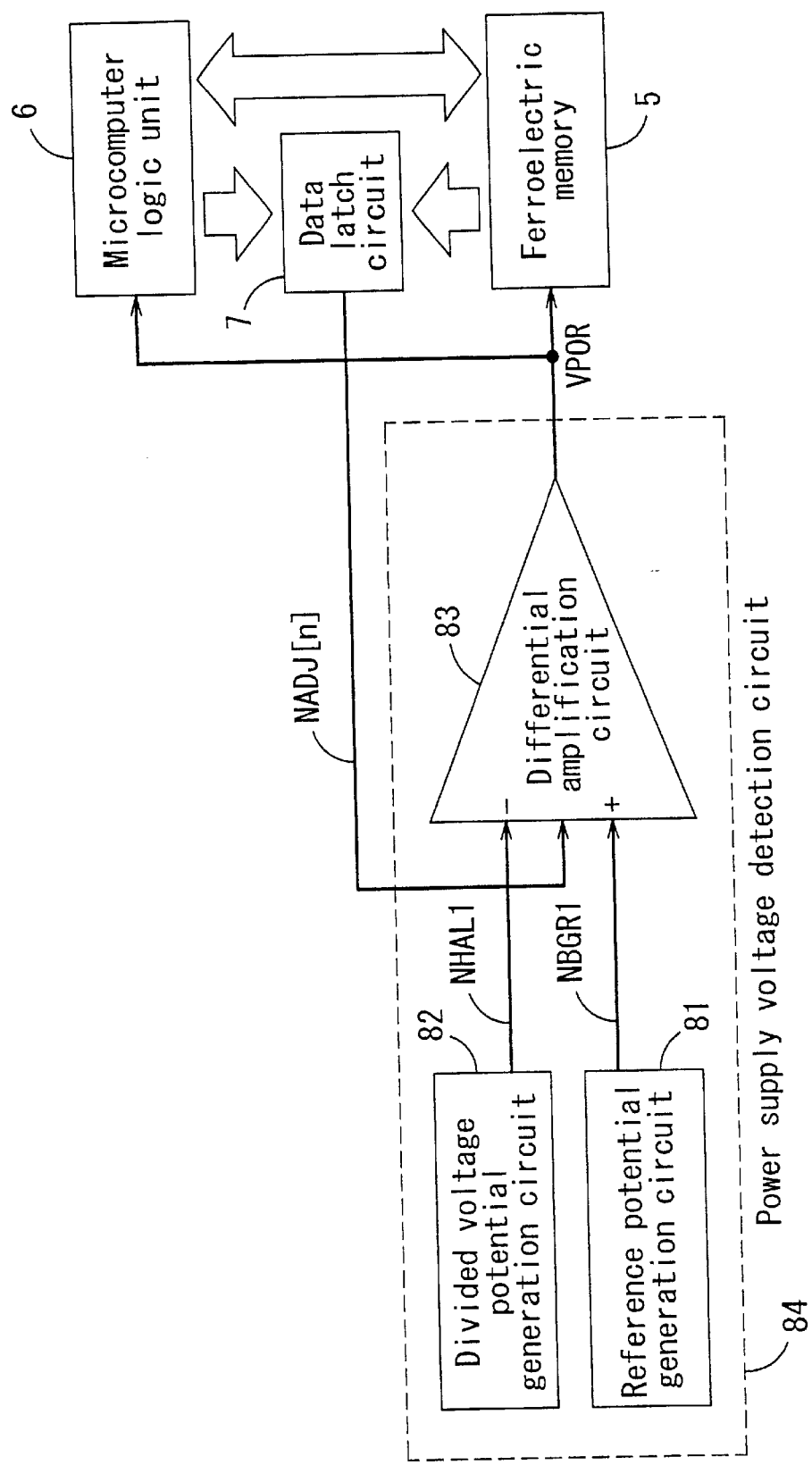
FIG. 8 is a block diagram of a semiconductor device having a detection voltage level correction circuit according to the sixth embodiment of the present invention.

FIG. 8 shows a semiconductor device having the voltage detection level correction circuit according to the sixth embodiment of the present invention.

A reference potential generation circuit represented by a band gap reference circuit is denoted as 81 and an output node for generating reference voltage level VBGR1 is denoted as NBGR1. A divided voltage potential generation circuit for generating a divided voltage level that is dependent on the power supply voltage is denoted as 82 and an output node for generating divided voltage level VHAL1 is denoted as NHAL1. A differential amplification circuit for comparing output signal voltage level VBGR1 to potential level VHAL1 so as to generate a comparison output VPOR is denoted as 83. In the case that the power supply voltage is no greater than the set voltage, that is to say, in the case that reference potential VBGR1 is higher than divided voltage potential VHAL1, output signal VPOR outputs the "H" logic level and converts microcomputer logic unit 6 and ferroelectric memory 5 to the inactive condition. In addition, in the case that the power supply voltage is no less than the set voltage, that is to say, in the case that reference potential VBGR1 is lower than divided voltage potential VHAL1, output signal VPOR outputs the "L" logic level and converts microcomputer logic unit 6 and ferroelectric memory 5 to the active condition. A power supply voltage detection circuit formed of reference potential generation circuit 81, divided voltage potential generation circuit 82 and differential amplification circuit 83 is denoted as 84.

A ferroelectric memory for storing arbitrary information is denoted as 5. A microcomputer logic unit for controlling ferroelectric memory 5 is denoted as 6. A data latch circuit for storing data read out from ferroelectric memory 5 and for storing output signals NADJ[n] utilized for correction of reference voltage potential VBGR1 is denoted as 7.

In addition, in the following description, it is assumed that the circuits (FIG. 11 and FIG. 12) described as conventional circuits are used for 81 and 82 in FIG. 8.

Here, it becomes possible to reduce the dispersion in the threshold values of the transistors in order to correct the voltage detection level by using a differential amplification circuit that is of the same type as differential amplification circuit 12 or 13 having the configuration described in the voltage detection level correction circuit (FIG. 4 or FIG. 5) according to the third or fourth embodiment for differential amplification circuit 83.

Though a voltage detection level correction circuit (first to fourth embodiments) for correcting the reference potential, a voltage detection level correction circuit (fifth embodiment) for correcting the divided voltage potential and a voltage detection level correction circuit (sixth embodiment) for correcting the output potential of the differential amplification circuit are shown above, it is possible to combine any two, or more, from among these three types so as to correct the voltage detection level in an effective manner.

Figure 9:
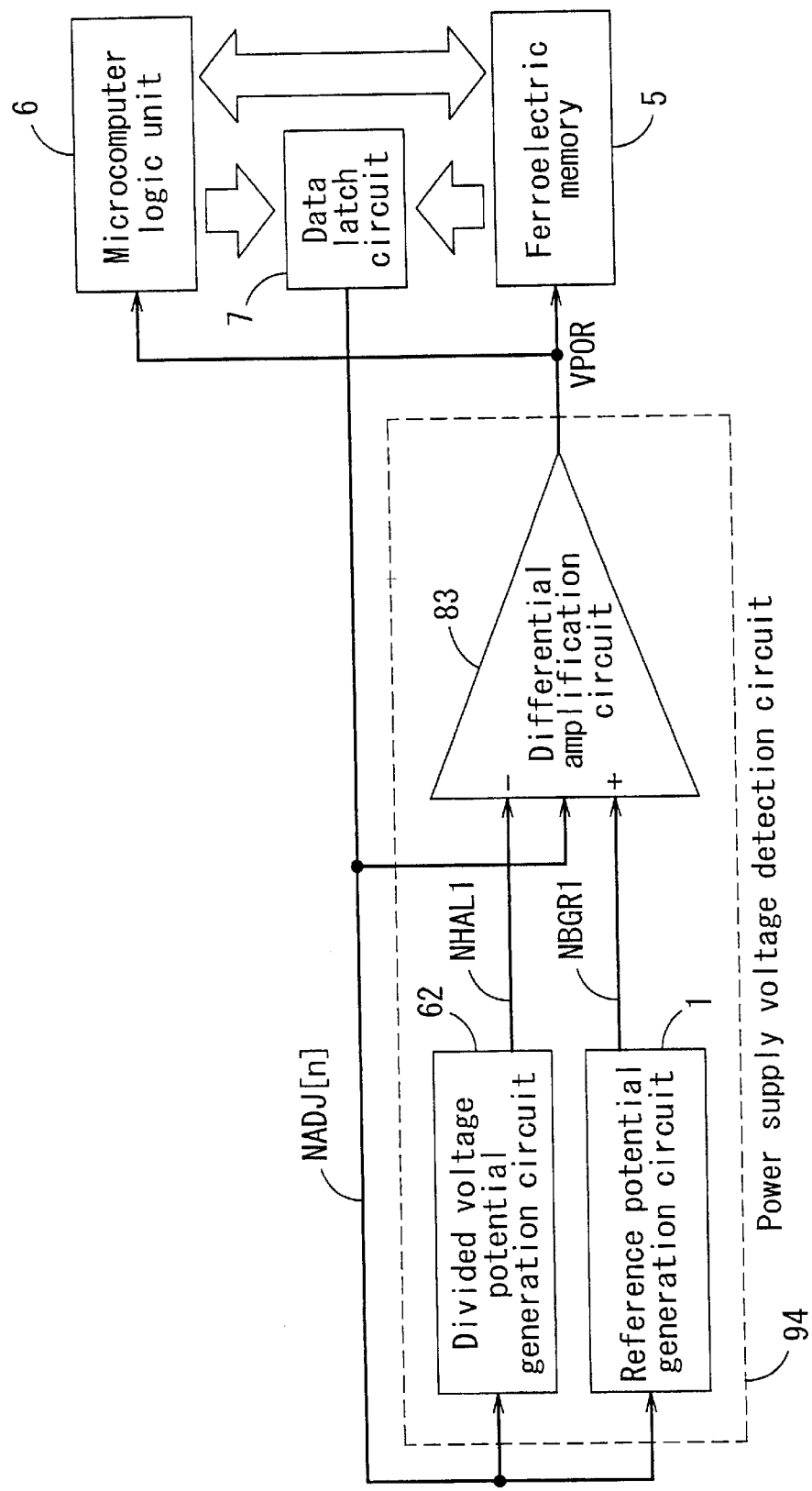
FIG. 9 is a block diagram of a semiconductor device having a detection voltage level correction circuit according to the seventh embodiment of the present invention.
Figure 10:
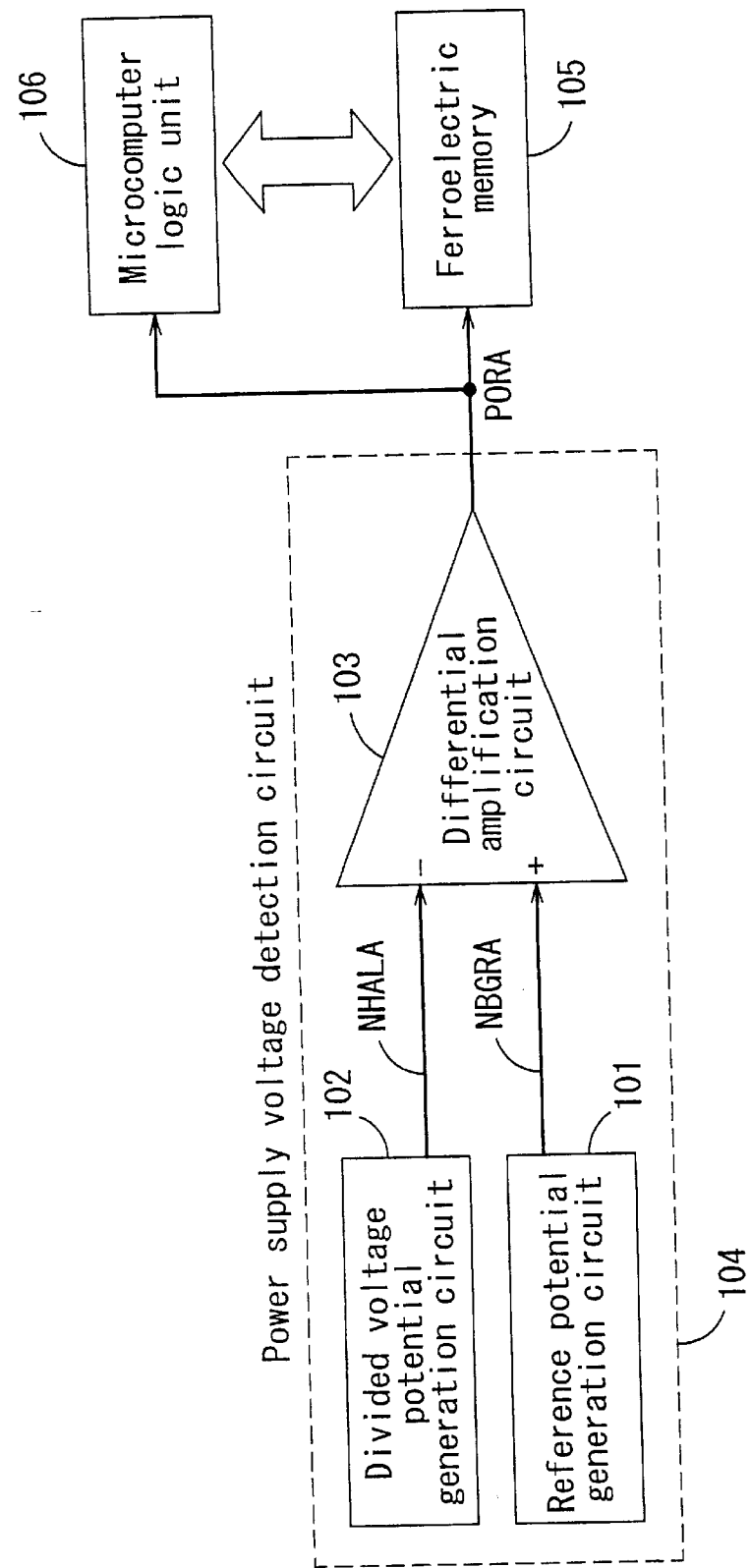
FIG. 10 is a block diagram of a semiconductor device having a power supply voltage detection circuit according to a prior art.

FIG. 9 shows a voltage detection level correction circuit according to the seventh embodiment, that is to say, a correction circuit in the case wherein the above described three types of voltage detection level correction circuits are combined.

A fine adjustment of the reference voltage for each chip becomes possible so that the precision of detection of the power supply voltage is increased even after completion of diffusion by implementing the configuration and control of the present invention described above in reference to FIGS. 1 to 9.

Though in the present description a ferroelectric memory 5 is referred to, prevention of malfunction and data protection in the case of fluctuation in the power supply during data write-in are common issues in regard to other non-volatile memories and, therefore, the present circuit configuration is effective with respect to generic non-volatile memories.

What is claimed is:

1. A voltage detection level correction circuit, comprising:
   a power supply voltage detection circuit having a reference potential generation circuit for generating a constant reference potential that is independent of a power supply voltage, a divided voltage potential generation circuit for generating a divided voltage potential gained by dividing said power supply voltage according to a constant ratio and a differential amplification circuit for comparing said reference potential with said divided voltage potential and for outputting an output signal in case that said divided potential is lower than said reference potential;
   a non-volatile memory which stores correction data for correcting said reference potential and which is converted to an inactive condition in response to said output signal of said differential amplification circuit;
   a data latch circuit for storing said correction data read out from said non-volatile memory; and
   a control circuit for reading out said correction data from said non-volatile memory and for making said correction data to be latched in said data latch circuit, wherein said reference potential generation circuit comprises a circuit which has circuit elements for varying said reference potential and which receives said correction data from said data latch circuit for switching of said circuit elements.

2. The voltage detection level correction circuit according to claim 1, wherein the resistance value of a resistance element existing within the reference potential generation circuit is altered according to the correction data and, thereby, the reference potential is altered.

3. The voltage detection level correction circuit according to claim 1, wherein the saturation current value of a diode element existing within the reference potential generation circuit is altered according to the correction data and, thereby, the reference potential is altered.

4. The voltage detection level correction circuit according to claim 1, wherein the reference potential generation circuit has a differential amplification circuit formed of transistors and wherein the size of a transistor having a gate connected to an input terminal of said differential amplification circuit, is altered according to the correction data and, thereby, the reference potential is altered.

5. The voltage detection level correction circuit according to claim 1, wherein the reference potential generation circuit has a differential amplification circuit that includes a current mirror circuit formed of transistors and wherein the mirror ratio of said current mirror circuit is altered according to the correction data and, thereby, the reference potential is altered.

6. The voltage detection level correction circuit according to claim 1, wherein at least two parameters from among the resistance value of a resistance element existing within the reference potential generation circuit, the saturation current value of a diode element existing within said reference potential generation circuit, the size of a transistor having a gate connected to an input terminal of a differential amplification circuit formed of transistors existing within said reference potential generation circuit and the mirror ratio of a current mirror circuit in a differential amplification circuit formed of transistors existing within said reference potential generation circuit, are altered according to the correction data and, thereby, the reference potential is altered.

7. The voltage detection level correction circuit according to claim 1, wherein said control circuit operates in response to an output signal of said differential amplifier.

8. A voltage detection level correction circuit, comprising:
   a power supply voltage detection circuit having a reference potential generation circuit for generating a constant reference potential that is independent of a power supply voltage, a divided voltage potential generation circuit for generating a divided voltage potential gained by dividing said power supply voltage according to a constant ratio and a differential amplification circuit for comparing said reference potential with said divided voltage potential and for outputting an output signal in case that said divided potential is lower than said reference potential;
   a non-volatile memory which stores correction data for correcting said divided voltage potential and which is converted to an inactive condition in response to said output signal of said differential amplification circuit;
   a data latch circuit for storing said correction data read out from said non-volatile memory; and
   a control circuit for reading out said correction data from said non-volatile memory and for making said correction data to be latched in said data latch circuit, wherein said divided voltage potential generation circuit comprises a circuit which has circuit elements for varying said divided voltage potential and which receives said correction data from said data latch circuit for switching of said circuit elements.

9. The voltage detection level correction circuit according to claim 8, wherein said control circuit operates in response to an output signal of said differential amplifier.

10. A voltage detection level correction circuit, comprising:
    a power supply voltage detection circuit having a reference potential generation circuit for generating a constant reference potential that is independent of a power supply voltage, a divided voltage potential generation circuit for generating a divided voltage potential gained by dividing said power supply voltage according to a constant ratio and a differential amplification circuit for comparing said reference potential with said divided voltage potential and for outputting an output signal in case that said divided potential is lower than said reference potential;
    a non-volatile memory which stores correction data for adjusting the sensitivity of said differential amplification circuit and which is converted to an inactive condition in response to said output signal of said differential amplification circuit;

a data latch circuit for storing said correction data read out from said non-volatile memory; and a control circuit for reading out said correction data from said non-volatile memory and for making said correction data to be latched in said data latch circuit, wherein said differential amplification circuit comprises a circuit which has circuit elements for adjusting the sensitivity of said differential amplification circuit so that a voltage detection level of said power supply voltage detection circuit can be corrected and which receives said correction data from said data latch circuit for switching of said circuit elements.

11. The voltage detection level correction circuit according to claim 10, wherein said control circuit operates in response to an output signal of said differential amplifier.

12. A voltage detection level correction circuit, comprising:

a power supply voltage detection circuit having a reference potential generation circuit for generating a constant reference potential that is independent of a power supply voltage, a divided voltage potential generation circuit for generating a divided voltage potential gained by dividing said power supply voltage according to a constant ratio and a differential amplification circuit for comparing said reference potential with said divided voltage potential and for outputting an output signal in case that said divided potential is lower than said reference potential;

a non-volatile memory which stores correction data for correcting said reference potential, correction data for correcting said divided voltage potential or correction data for adjusting the sensitivity of said differential amplification circuit and which is converted to an inactive condition in response to said output signal of said differential amplification circuit;

a data latch circuit for storing said correction data read out from said non-volatile memory; and a control circuit for reading out said correction data from said non-volatile memory and for making said correction data to be latched in said data latch circuit, wherein at least two circuits from among said reference potential generation circuit, said divided voltage potential generation circuit and said differential amplifier comprise respective circuits which have circuit elements for varying said reference potential, said divided voltage potential or the sensitivity of said differential amplification circuit and which receives said correction data from said data latch circuit for switching of said circuit elements.

13. The voltage detection level correction circuit according to claim 12, wherein said control circuit operates in response to an output signal of said differential amplifier.

14. A semiconductor device on which the voltage detection level correction circuit according to claim 1 is mounted.

* * * * *